United States Patent
Bohlender et al.

(10) Patent No.: US 9,655,263 B2
(45) Date of Patent: May 16, 2017

(54) SEALED HOUSING AND METHOD OF PRODUCING THE SAME

(71) Applicant: Eberspacher catem GmbH & Co. KG, Herxheim (DE)

(72) Inventors: Franz Bohlender, Kandel (DE); Michael Niederer, Kapellen-Drusweiler (DE)

(73) Assignee: Eberspacher catem GmbH & Co. KG, Herxheim (DE)

( * ) Notice: Subject to any disclaimer, the term of this patent is extended or adjusted under 35 U.S.C. 154(b) by 450 days.

(21) Appl. No.: 14/255,066

(22) Filed: Apr. 17, 2014

(65) Prior Publication Data

US 2014/0319125 A1 Oct. 30, 2014

(30) Foreign Application Priority Data

Apr. 26, 2013 (EP) ..................................... 13002232

(51) Int. Cl.
*H05B 3/06* (2006.01)
*H05K 5/06* (2006.01)
*F24H 3/04* (2006.01)
*F24H 9/02* (2006.01)
*F24H 9/14* (2006.01)

(52) U.S. Cl.
CPC ............ *H05K 5/069* (2013.01); *F24H 3/0464* (2013.01); *F24H 9/02* (2013.01); *F24H 9/14* (2013.01); *Y10T 29/49826* (2015.01)

(58) Field of Classification Search
CPC ..... H05K 5/069; F24H 3/0464; F24H 3/0429; F24H 3/0435; F24H 3/0452; F24H 3/0458; F24H 9/02; F24H 9/14; F24H 9/1827; Y10T 29/49826; Y10T 29/49876
See application file for complete search history.

(56) References Cited

U.S. PATENT DOCUMENTS

2012/0145278 A1* 6/2012 Rosch ................ G01N 30/0005
138/177

FOREIGN PATENT DOCUMENTS

| DE | 196 42 442 A1 | 4/1998 |
| FR | 2 411 772 A1 | 7/1979 |
| FR | 2 471 324 A1 | 6/1981 |

* cited by examiner

*Primary Examiner* — Shawntina Fuqua (57) ABSTRACT

A sealed housing of an electric heating device to be installed in a motor vehicle includes a housing lower part and a housing cover abutting on the housing lower part via an intermediate sealing element. An elongate positive locking element, which interconnects the housing lower part and the housing cover in a form fit manner, is provided between opposed contact surfaces of the housing lower part and a housing cover. The positive locking element abuts on the contact surfaces under a pretensioning force caused by compression of the sealing element. A method of producing a sealed housing also is disclosed via which the contact surfaces move into contact with the elongate positive locking element under a pretensioning force of the sealing element.

20 Claims, 10 Drawing Sheets

SEALED HOUSING AND METHOD OF PRODUCING THE SAME

BACKGROUND OF THE INVENTION

1. Field of the Invention

The present invention relates to a sealed housing of a device to be installed in a motor vehicle as well as to a method of producing the same.

2. Description of the Related Art

Sealed housings in motor vehicles may accommodate e.g. control devices which should be hermetically sealed in the housing in a dustproof manner. These devices are especially electronic control devices, which may be sensitive to contamination and environmental influences as well as humid air. A sealed housing according to the present invention may, however, also be a housing in which a medium is conducted and/or accommodated.

Such a sealed housing is known e.g. from DE 196 42 442 A1. This publication discloses a sealed housing of an electric heating device comprising a housing lower part and a housing cover, which abuts on the housing lower part via an intermediate sealing element.

EP 2 440 004 A1, which is owned by the present applicant, also discloses a sealed housing of an electric heating device. This publication discloses in its FIG. 7 two identically configured housing parts which are interconnected via an intermediate sealing layer and which each define a circulation chamber for a fluid to be heated.

This known prior art as well as the prior art according to DE 196 42 442 A1 disclose, in essence, a water heater, i.e. a heater, accommodating a fluid medium in the housing lower part. The housing lower part is closed by the housing cover, the sealing element preventing leakage at the location where the housing lower part and the housing cover are joined.

In the case of the housings to be sealed in the above-mentioned prior art examples, the housing cover is screw-fastened to the housing lower part. In the automotive industry, screw connections must nowadays satisfy special demands for reasons of quality control. Normally, the torque is measured during tightening of the screw connection, so that possible complaints can be traced later on. In particular when the components in question are safety relevant, the torque measured during screw-fastening of the housing is additionally documented and archived.

Screw connections are additionally disadvantageous insofar as they may become loose due to the vibrations in the vehicle. The desired leakproofness of the sealed housing will thus get lost. In the case of a water heater, the medium conducted in the heating circuit may escape through the leak, and this may result in excessively high temperatures in the system and cause substantial damage to the system in its entirety.

It is indeed possible to join the housing cover and the housing lower part by welding or by an adhesive, but this kind of connection between the two housing parts prevents easy opening of the housing for the purpose of revision or repair. Therefore, the sealed housing can normally be disposed of only together with the device contained in the housing. In addition, only housing parts consisting of identical substances can be joined by welding.

Sometimes, it is necessary to configure housings such that weight is saved, in which case plastic will be the obvious material to use. The housing is, however, arranged close to temperature sources and/or may surround and/or contain these sources of heat, and this prevents—depending on the actually occurring temperatures—the use of plastic, at least for certain parts of the housing. Producing the housing of identical substances is thus not always possible.

Especially in media-carrying housings, substantial tensions may occur on the joining area due to the operating pressure of the respective medium, and a welded joint, in particular a welded joint of plastic materials, will not always be able to reliably resist these tensions. Hence, a welded joint between the housing parts to be joined entails the risk that the housing will fail when subjected to an internal pressure of the medium accommodated and sealed in the sealed housing.

SUMMARY OF THE INVENTION

The present invention is based on the problem of providing a housing which will avoid the above drawbacks fully or partly. The present invention aims at providing a housing which can be produced easily and economically and which, in addition, should be suitable for being opened in a non-destructive manner for the purpose of revision and repair. The present invention additionally aims at providing a method of producing a sealed housing of a device to be installed in a motor vehicle. In this respect, the present invention especially aims at providing a housing of a water heater in a motor vehicle or a water heater as such. This means, as far as the present application relates to water as the medium to be heated, that the present invention especially aims at providing a fluid heater. In a vehicle, water used as a tempering medium is normally mixed with additives, so as to reduce the corrosive effect and prevent the water from freezing at the normally prevailing ambient temperatures. A water heater within the meaning of the present invention is therefore primarily a fluid heater which is suitable for heating water as well as water mixtures, in particular mixtures containing a comparatively high percentage of glycol of up to 50% by weight.

For accomplishing the device-related aspect, the present invention suggests a sealed housing having a housing lower part and a housing cover abutting on the housing lower part via an intermediate sealing element. An elongate positive locking element interconnects the housing lower part and the housing cover in a form fit manner and is provided between opposed contact surfaces of the housing lower part and a housing cover. The positive locking element also abuts on the contact surfaces under a pretensioning force caused by compression of the sealing element.

The sealed housing according to the present invention comprises an elongate positive locking element by means of which the housing lower part and the housing cover are interconnected in a form fit manner. The positive locking element is provided between opposed contact surfaces for the positive locking element of the housing lower part and the housing upper part. It may project beyond said contact surfaces of the housing lower part and the housing upper part on one or on both sides thereof, i.e. it may enframe the respective contact surfaces and accommodate them. Alternatively, it may, however, also be provided exclusively between the opposed contact surfaces of the housing lower part and the housing cover.

The positive locking element additionally abuts on the contact surfaces under a pretensioning force. This pretensioning force is caused by compression of the sealing element. Accordingly, the positive locking element is used not only for keeping the two housing parts, i.e. the housing lower part and the housing cover, together and for securing them in position relative to one another in a form fit manner, but also for causing a counterforce acting in a direction opposite to the desired expansion of the sealing element and keeping the latter compressed, so that the two housing parts are sealingly secured in position relative to one another with the intermediate compressed sealing element extending between them. By adequately adapting the positive locking element on the one hand as well as the contact surfaces of the housing lower part and the housing cover on the other, and, in addition, by adequately dimensioning the sealing element, care is taken that possible manufacturing variations can be compensated for by different degrees of compression of the sealing element, without any risk that the sealing of the housing may fail. What is here sealed is especially a chamber surrounded at least by the housing lower part and used for accommodating e.g. the fluid or the electronic components.

The elongate positive locking element and consequently the opposed contact surfaces normally extend parallel to a joint formed between the housing lower part and the housing cover and sealed by the sealing element. The sealing element extends here circumferentially and without any interruption in the peripheral direction, so that the chamber surrounded by the housing lower part is sealed off from the surroundings. The elongate positive locking element normally extends only along a single, normally straight longitudinal wall of the housing. The elongate positive locking element is therefore preferably straight in shape, i.e. it extends parallel to the associated side wall.

For sealing the housing, a single elongate positive locking element will suffice. This elongate positive locking element normally has a length corresponding approximately to the length of the associated side wall of the housing. On the opposite side wall of the housing, the housing cover may be connected to the housing lower part, e.g. by a hinge. Also snap connections of the conventional type are imaginable, by means of which the housing lower part and the housing cover are interconnected on the side located opposite to the positive locking element. These snap connections should be configured such that they allow a certain pivotal movement between the housing lower part and the housing cover about the snap connection.

The elongate positive locking element may consist of a simple rod, in particular a cylindrical rod. The cross-sectional shape of the substantially cylindrical positive locking element is of secondary importance. What matters is an adaptation of the elongate positive locking element to the surface shape of the contact surface.

The elongate positive locking element is friction-locked between the contact surfaces due to the pretensioning force of the sealing element. The friction force acting here on the elongate positive locking element normally prevents a sliding movement of the elongate positive locking element in its longitudinal direction.

In view of the vibrations prevailing in the vehicle, additional measures are, however, suggested, which will improve handling of the sealed housing during closing and a permanent closure of the sealed housing with the positive locking element.

The elongate positive locking element is therefore retained in a form fit manner preferably by retaining surfaces extending transversely to the elongate positive locking element. These retaining surfaces project from the contact surfaces of the housing lower part and/or the housing cover and are normally located on the outer side of the elongate positive locking element. Accordingly, the elongate positive locking element is retained in a form fit manner by the retaining surfaces between the outer wall of the housing and the retaining surfaces.

The retaining surfaces of the contact surfaces provided on the housing lower part normally project from the housing lower part towards the housing cover. In a corresponding manner, retaining surfaces, which are provided alternatively or supplementarily on the housing cover, project from the associated contact surfaces towards the housing lower part. A form fit accommodation of the elongate positive locking element in a direction transversely to its length is thus accomplished. The elongate positive locking element is therefore secured in position in a form fit manner between the retaining surfaces and the housing wall.

The housing cover is preferably made of a highly heat-conductive material, in particular a metal, and according to a particularly preferred embodiment it is produced by means of die casting. The housing cover may consist e.g. of copper or aluminum and define at least one radiator, which accommodates an electric heating unit. Also a plastic material filled with a highly heat-conductive filling material is a highly heat-conductive material within the meaning of the present invention. Such a housing cover consisting of a highly heat-conductive material is preferably connected in the way described in the present invention to a housing lower part made of plastic. If such a housing lower part made of plastic is combined with and closed by a housing cover made of aluminum, a comparatively light structure is obtained, which is particularly suitable for use as a weight-saving housing of an electric heating device in a motor vehicle. The highly heat-conductive material has a thermal conductivity of at least 160 W/(m K).

According to a preferred further development of the present invention, the positive locking element is retained in its longitudinal direction in a form fit manner. To this end, a projection may be provided or arranged before and/or behind the elongate positive locking element, i.e. in axial alignment therewith, when said positive locking element has been installed by moving it in its longitudinal direction. This projection may be defined by the housing lower part or the housing cover. It is also imaginable to define said projection by a further component of the sealed housing, e.g. by outer surfaces of a control housing, which is connected to the housing lower part and/or housing cover and which accommodates therein control components acting on units provided in or on the sealed housing. The form fit holding means may, however, also be defined by a projection, a recess or a cam on the elongate positive locking element, which cooperates with a contact surface or a recess associated with the contact surface, so as to secure the elongate positive locking element in position in a form fit manner in the longitudinal direction.

According to a preferred further development of the present invention, the housing lower part and the housing cover are provided with interengaging fastening sections. These fastening sections are provided alternately and in succession in the direction of extension of the positive locking element. Fastening sections of the housing lower part thus alternate with fastening sections of the housing cover. The fastening sections of the different housing parts, thus interengage in the direction of extension of the positive locking element. These fastening sections define the contact surfaces, said contact surfaces being defined such that the contact surface defined by the housing lower part projects beyond a contact surface defined by the housing cover and provided on the fastening section of the housing cover. This view is based on the assumption that the housing stands on a surface defined by the housing lower part and the housing cover covers the housing upper part on the top.

As has already been mentioned hereinbefore, the positive locking element is normally provided on the outer side of the housing directly adjacent the outer wall thereof. To this end, fastening heads preferably project from the fastening sections, said fastening heads defining the contact surfaces. The fastening heads project beyond the outer surface of the normally smooth and plane housing.

Taking into account the desired form fit retention of the elongate positive locking element in a direction transversely to its direction of extension, the fastening heads of the housing lower part and/or housing cover are here hook-shaped. The fastening head provided on the housing lower part thus comprises a locking pin projecting beyond the contact surface and protruding in the direction of the housing lower part. The fastening head provided additionally or alternatively on the housing cover comprises a locking pin, which projects beyond the contact surface of said locking pin and protrudes in the direction of the housing cover. The locking pins define a contact surface which grips the elongate positive locking element on its side facing away from the housing. The elongate positive locking element is thus lockingly clamped in position between the housing wall and the locking pin by the fastening heads, and the locking pins define the above described retaining surfaces on their side facing the positive locking element.

According to an alternative embodiment, a plurality of locking heads and a locking slide are provided. The locking heads are adapted to be passed through an insertion opening formed on the locking slide and/or the housing lower part and the housing cover, respectively. The insertion openings are therefore dimensioned such that the locking heads can be passed therethrough. The insertion openings are followed by locking openings. These locking openings have a clear width which is smaller than that of the insertion openings. The locking heads are therefore dimensioned such that locking heads accommodated in the locking openings are retained in a form fit manner in a direction transversely to the direction of extension of the elongate positive locking element. To this end, the locking heads preferably comprise a locking projection protruding beyond the contact surface and defining the above-discussed retaining surface in the preferred embodiment now described. When the locking head is accommodated in the locking opening, the locking projection overlaps the locking opening, whereby the elongate positive locking element is secured in position in a form fit manner relative to the housing on the positive locking element side facing away from the housing.

For the purpose of lockingly securing the elongate positive locking element in position in its main direction of extension, a locking cam projecting beyond the locking opening is provided preferably between the insertion opening and the locking opening. This locking cam is configured such that, when the locking head is accommodated in the locking opening, the locking cam engages behind the locking head, so that an inadvertent displacement of the elongate positive locking element is prevented through a form fit engagement between the locking head and the locking cam. Such a locking cam is preferably provided between each insertion opening and the locking opening associated therewith. All the insertion and locking openings are preferably configured identically and are spaced apart at identical transverse distances.

In order to accomplish a housing lower part and the housing cover whose walls are as thin as possible as well as a simple production of the elongate positive locking element, a preferred further development of the present invention suggests that the locking heads should be provided on the housing lower part and on the housing cover such that they project beyond an outer surface of the housing. The insertion and locking openings are formed on the locking slide, which defines the elongate positive locking element of the present invention. Hence, a simple embodiment of the elongate locking slide is defined by a sheet metal strip, which has been punched for forming the insertion and locking openings. In addition to these openings, the locking slide may have further openings. These openings serve the purpose of weight reduction on the one hand. On the other hand, the claws of a pushing tool can be inserted in these additional openings, so as to longitudinally displace the locking slide after insertion of the locking heads into the insertion openings and establish the form fit connection under compression of the sealing element.

The housing according to the present invention can be sealed easily without any necessity of tightening screws. By adapting the structural design of the contact surfaces and of the positive locking element, possible manufacturing tolerances can be taken into account. If the predetermined manufacturing tolerances are observed in the production of the individual components, a fact that can be documented when the components are being produced, the resultant defined form fit connections will inevitably be provided within the given tolerances, thus fulfilling the predetermined leakproofness, while excluding the risk of mounting errors caused e.g. by excessive or insufficient tightening of fastening elements such as screws or the like.

The housing according to the present invention, in particular the housing of a water heater, consists fully or partly of a light plastic material that can be produced at a reasonable price. If the housing includes parts that are acted upon by heat, the form fit connection allows housing parts consisting of different materials to be easily joined and connected in a fluid tight manner, even if a considerable internal pressure should prevail in the sealed housing. The housing according to the present invention will be leakproof even if an internal pressure of up to 3 bar, preferably up to 5 bar, should prevail therein. This leakproofness is normally accomplished in the sealed housing according to the present invention without screws or other fastening means, which are to be tightened manually or mechanically, being used. Normally, the sealed housing does not comprise any screws at all. All the connections, at least between the housing lower part and the housing cover, are normally established and maintained by means of form fit engagement. Also the other connections on the sealed housing are preferably configured exclusively as form fit elements.

For solving the above described problem with respect to the heating system, the present invention suggests such a heating system having the features according to claim 15. This heating system is realized for a vehicle that is to be operated electrically. This electrically operated vehicle may be an electrically operated vehicle or a hybrid vehicle that may be driven by an internal combustion engine in the manner known as well as by an electric drive motor. In addition to such a drive motor and a battery supplying the drive motor, the heating system is provided with a heat exchanger for exchanging heat between the battery and a fluid circuit. The fluid circuit comprises the above specified water heater as one component. The battery is especially a lithium ion battery whose performance depends on the actual operating temperature to a decisive extent. Ideally, the battery temperature should be between 15 and 30° C. Outside this range, a substantial decrease in battery performance will occur. In the heating system described, the water heater is therefore provided for heating the battery within the heating system to the necessary operating temperature, if the ambient temperature should fall below the above described preferred temperature range for the battery temperature. According to a preferred embodiment, also a cooler may be provided as part of the heating system, said cooler cooling the fluid in the fluid circuit and extracting heat from the battery through the heat exchanger, if the preferred temperature range for the battery temperature should be exceeded. The heating system is therefore a tempering system with which tempering of the battery to the preferred temperature range of from 15 to 30° C. can be accomplished. The system normally comprises also a pump with which the fluid can circulate in the fluid circuit and can be conducted, during such circulation, through the water heater and/or the cooler on the one hand and through the heat exchanger on the other.

In order to solve the method-related problem, the present invention describes a method of producing a sealed housing of a device to be installed in a motor vehicle. The device is in particular a heating device. The housing comprises a housing lower part and a housing cover, which abut on one another—in the way described above—via an intermediate sealing element.

In the case of the method according to the present invention, the housing lower part and the housing cover are first produced as separate components. Then, the housing lower part and the housing cover are positioned such that they abut against one another under compression of the sealing element disposed therebetween. For compressing the sealing element, an external force is applied to the housing lower part and the housing cover, respectively. The compression of the sealing element through the external force is here stronger than the compression of the sealing element after joining of the housing lower part and the housing upper part, i.e. after establishing the form fit connection between the housing lower part and the housing cover. To this end, an elongate positive locking element is introduced between the opposed contact surfaces of the housing lower part and the housing cover. In so doing, the elongate positive locking element is normally displaced longitudinally in its direction of extension and moved to a position between the opposed contact surfaces. The main direction of extension of the elongate positive locking element corresponds to the main direction of extension of the sealing element. In other words, the direction of extension of the elongate positive locking element should preferably be parallel to the direction of extension of the sealing element. The sealing element may be provided on different planes determining the respective direction of main extension and slope sections may be provided between the planes, but such slope sections will only constitute a comparatively small percentage of the circumferentially extending sealing in the structural design of the sealing between the housing lower part and the housing cover. Ideally, the sealing element extends in only one plane, which is perpendicular to the joining direction of the housing lower part and the housing cover, the external force being applied at right angles to this plane. When the elongate positive locking element has been moved to its final position, at which the elongate positive locking element cooperates with the contact surfaces and normally covers all the contact surfaces, the housing lower part and the housing cover are relieved from the external force. This has the effect that the contact surfaces will move into contact with the elongate positive locking element under the pretension of the sealing element. In other words, the elongate positive locking element creates through a form fit connection a holding force that counteracts the force of the sealing element with which said sealing element tries to move the housing lower part and the housing cover apart. A form fit and leakproof connection has now been established between the housing parts. The housing is sealed and the sealing effect is accomplished by a form fit connection.

The external force may be applied e.g. by a pressing tool, which presses the housing cover against the housing lower part under compression of the sealing element. The opposed contact surfaces are thus spaced apart more widely than in the mounted condition. The elongate positive locking element can therefore be introduced past the opposed contact surfaces to a position between said contact surfaces with a certain amount of play or with only minor frictional forces occurring. This insertion movement is carried out in the longitudinal direction of the elongate positive locking element.

The method according to the present invention can therefore be executed particularly easily and simple and reliable sealing of the housing is achieved.

In addition, the housing may be formed fully or partly of light plastic material which can be produced at a reasonable price. If the housing includes parts that are acted upon by heat, the form fit connection allows housing parts consisting of different materials to be easily joined and connected in a fluid tight manner, even if a considerable internal pressure should prevail in the sealed housing. The housing according to the present invention will be leakproof even if an internal pressure of up to 3 bar, preferably up to 5 bar, should prevail therein. This leakproofness is normally accomplished in the sealed housing according to the present invention without screws or other fastening means, which are to be tightened manually or mechanically, being used. Normally, the sealed housing does not comprise any screws at all. All the connections, at least between the housing lower part and the housing cover, are normally established and maintained by means of form fit engagement. Also the other connections on the sealed housing are preferably configured exclusively as form fit elements.

BRIEF DESCRIPTION OF THE DRAWINGS

Further details and advantages of the present invention can be seen from the description of embodiments in connection with the drawing, which will follow hereinbelow. In the drawing.

DETAILED DESCRIPTION OF THE PREFERRED EMBODIMENT

Figure 1:
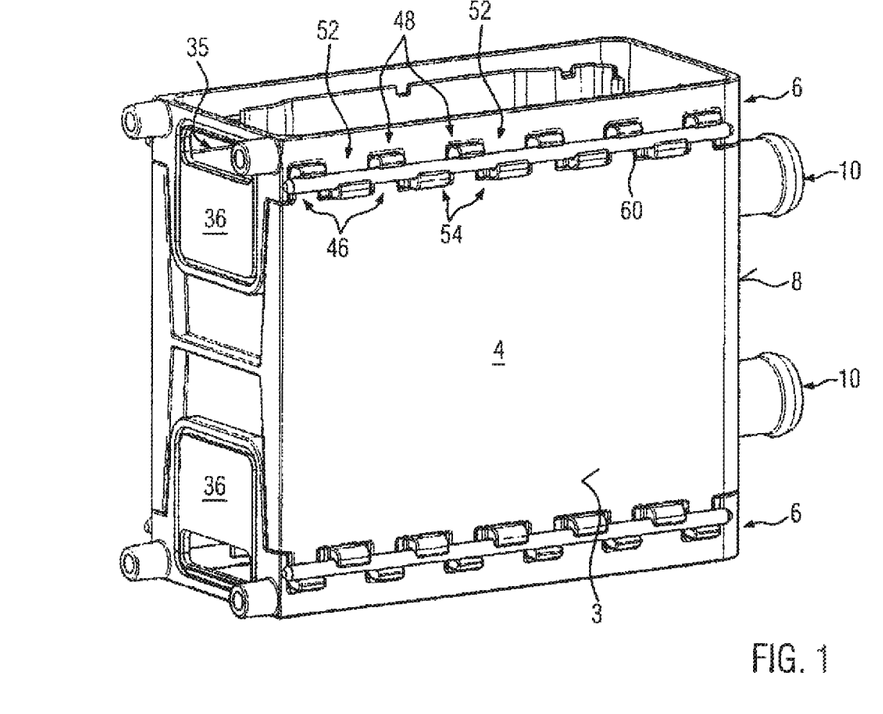
FIG. 1 shows a perspective side view of a first embodiment of a sealed housing.

FIG. 1 shows a perspective view of a sealed housing 2 including a plane, straight outer wall 3 and configured here as three-part housing comprising a housing lower part 4 and two opposed housing covers 6. The housing covers 6 are configured identically and produced as aluminum pressure die castings. The housing lower part 4 is an injection molded plastic component provided with two parallel connection pieces 10 projecting from the first end face 8 thereof. As can especially be seen from FIGS. 3 and 4, the housing lower part 4 is formed integrally with these connection pieces 10 and is also formed integrally with a central partition 12 separating two circulation chambers 14a, 14b, which communicate with one another via a flow passage 16 formed in the partition thus allowing a flow from one connection piece 10 through the associated circulation chamber 14a, through the flow passage 16 and the other circulation chamber 14b, said flow being conducted out of the housing 2 through the other connection piece 10.

Figure 4:
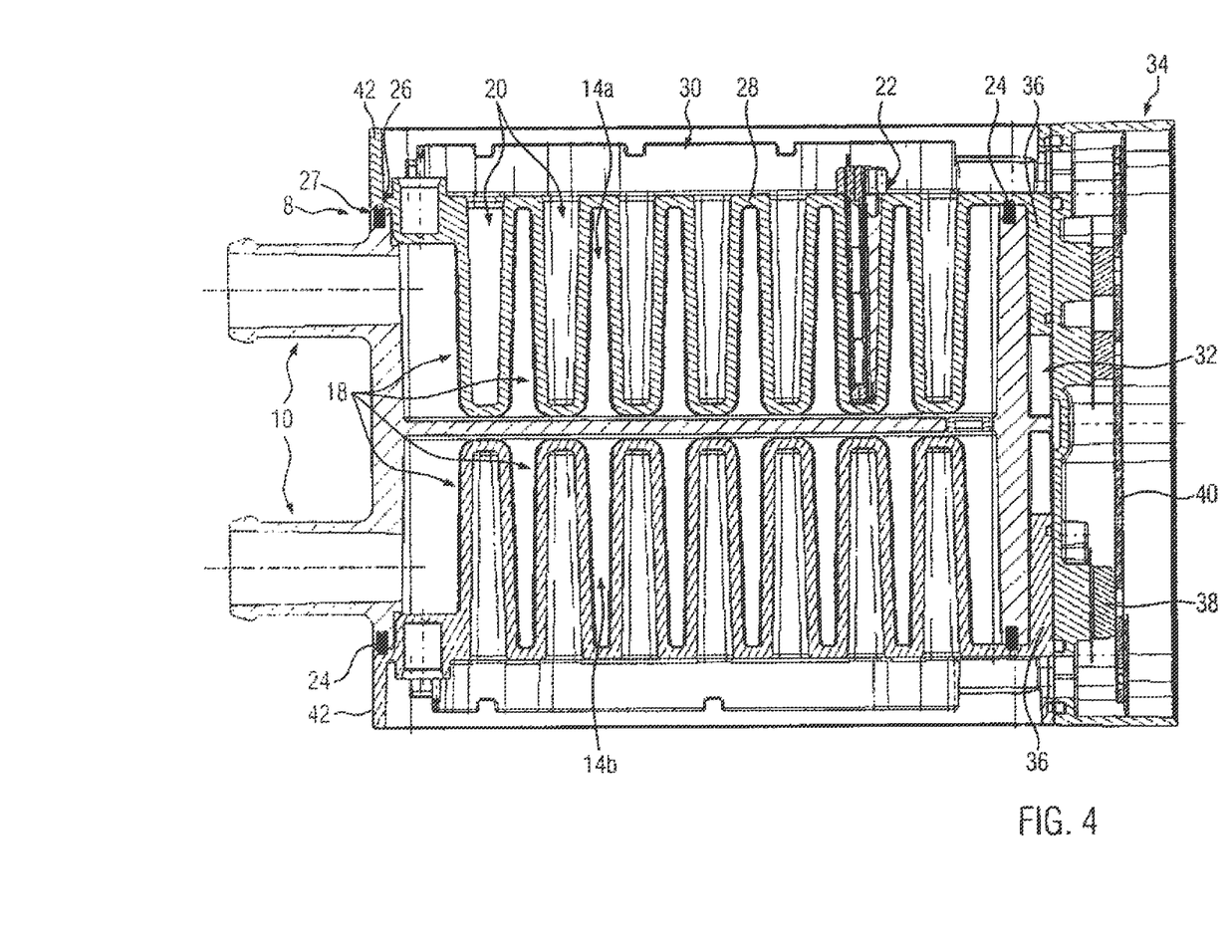
FIG. 4 shows a longitudinal sectional view of a first embodiment, with a control housing attached.

In the embodiment shown, the housing cover 6 is provided not only as a cover for the circulation chambers 14a, 14b, but it also defines radiators 18 with respective U-shaped openings 20. These U-shaped openings 20 have electric heating elements installed therein. In FIG. 4, a PTC heating element 22 is shown, which is configured in the way described in EP 1 872 986 A1 and EP 1 921 896 A1 and which is accommodated in the U-shaped opening 20 in the way described e.g. in EP 2 440 004 A1. As regards the concrete structural design of the PTC heating element 22 and its arrangement within the U-shaped openings 20, reference is made to the above-mentioned unexamined patent applications of the present applicant whose disclosed content is insofar incorporated by reference in the disclosure of the present application.

Figure 3:
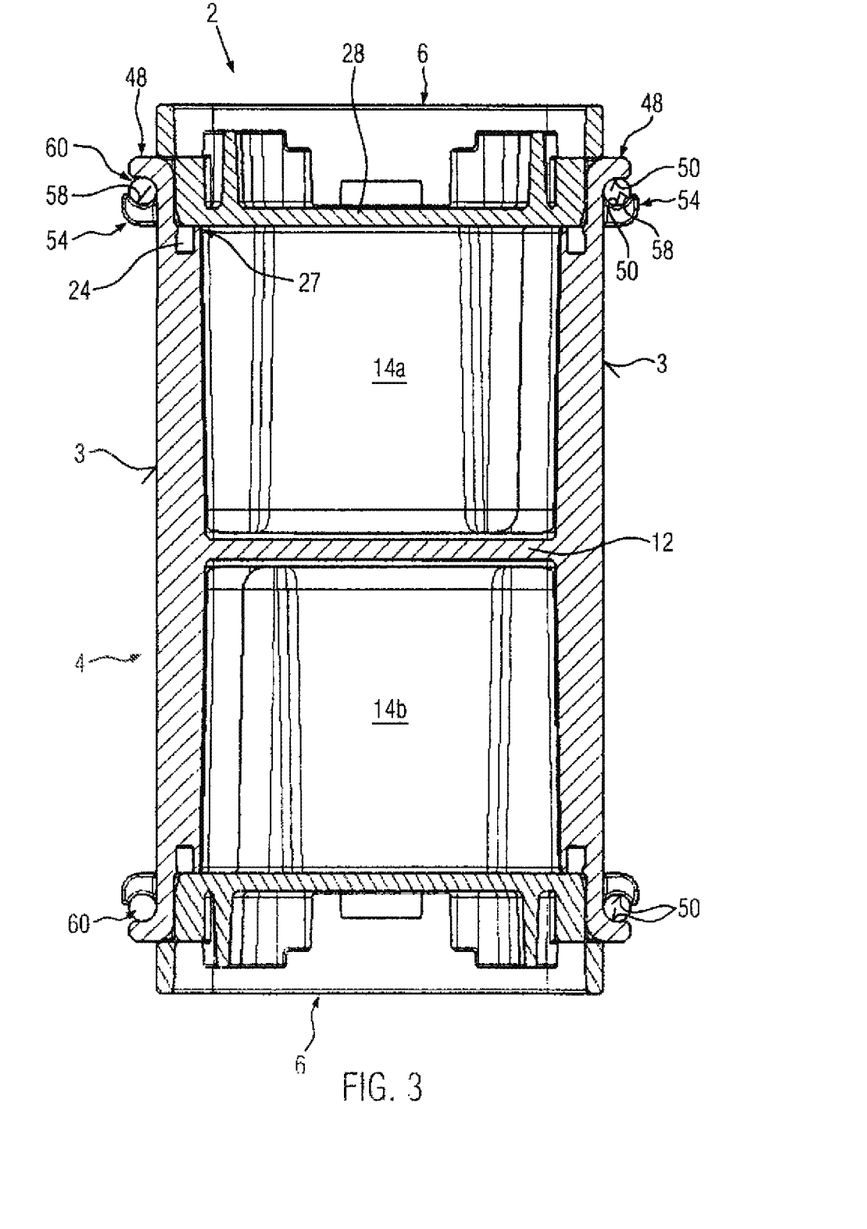
FIG. 3 shows a cross-sectional view of the embodiment according to FIGS. 1 and 2.

As can additionally be seen from the sectional views according to FIGS. 3 and 4, the housing cover 6 abuts on the housing lower part 4 via an intermediate sealing element 24. The sealing element 24 is inserted and held in position in a groove 26 formed on the housing lower part 4. The sealing element 24 projects beyond a front end face of the housing lower part 4 to which the housing cover 6 is attached thus forming a joint 27.

The housing cover 6 has, in addition to the U-shaped openings 20, a partition 28 separating the associated circulation chamber 14 from a connection chamber 30 which is essentially surrounded by the housing cover 6. In this connection chamber 30 the PTC heating elements 22 are contacted in the way described in EP 2 440 004 A1 with a conductor board, which is not shown and the conductive paths of which extend up to the second end face 32 and through an opening 35 provided on said second end face 32 into a control housing 34 provided there, as described in EP 2 440 004 A1 and in EP 1 872 986 A1 of the present applicant. The disclosed content of these publications is insofar included by reference in the disclosed content of the present application.

As is especially illustrated in FIG. 4, the housing cover 6 is provided with a contact leg 36, which is formed on the housing cover 6 integrally therewith and which is exposed on the second end face 32 of the housing lower part 4 (cf. FIGS. 1 and 4). This contact leg 36, which is connected to the radiators 18 within the housing lower part 4 in a heat conductive manner, serves as a heat sink and as a contact surface for dissipating power losses of power transistors 38 provided within the control housing 34, said power transistors 38 being secured to a lower side of a conductor board 40 and positioned in contact with the contact leg 36, as described in detail in EP 2 440 004 A1. Also insofar, the disclosed content of EP 2 440 004 A1 is to be considered as part of the disclosed content of the present patent description.

The contact leg 36 is exposed on the second end face 32, i.e. it overlaps the housing lower part 4 on the outer side thereof and, due to the fact that it is integrally formed with the radiators 18 around which the fluid accommodated in the circulation chamber 14 flows, it defines the heat sink.

Figure 10:
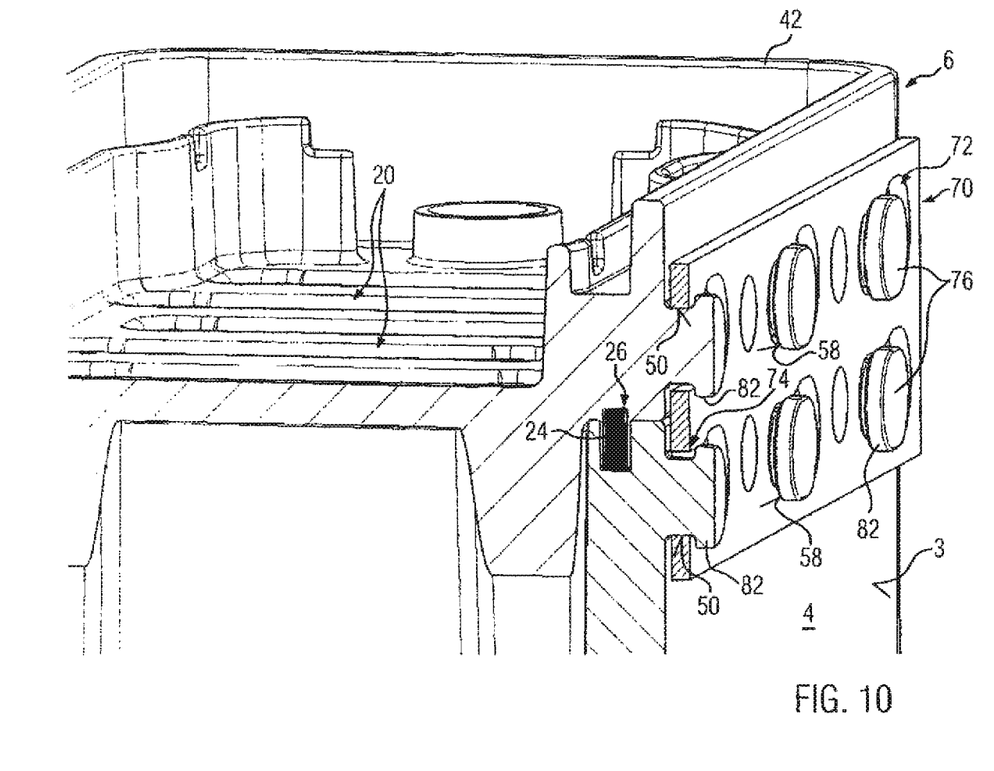
FIG. 10 shows a perspective sectional view along the line X-X according to FIG. 9.

The housing cover 6 has a circumferentially extending edge 42 onto which a connection cover—not shown—can be clipped in position (cf. FIG. 10).

Figure 2:
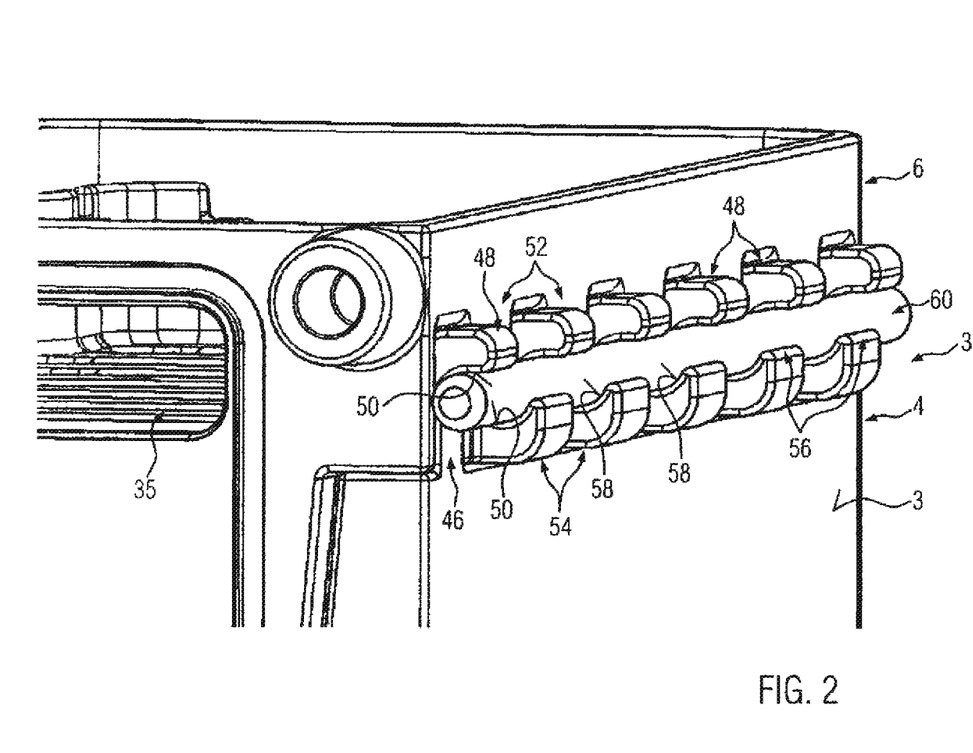
FIG. 2 shows a perspective side view of an enlarged detail of the embodiment according to FIG. 1.

The fluid-tight cover of the housing lower part 4 can especially be seen from FIGS. 1 and 2. As can be seen from these two figures, the housing lower part 4 comprises a plurality of spaced apart fastening sections 46 provided on the outer wall 3, i.e. on the longitudinal side of the housing 2, in the plane of this outer wall 3. The fastening sections 46 have fastening heads 48 projecting beyond the outer wall 3 and defining a contact surface 50 which extends substantially at right angles to the outer wall 3.

Also the housing cover 6 is provided with fastening sections 52, which are spaced apart from one another such that the fastening elements 46 of the housing lower part 4 can project between neighboring fastening sections 52 of the housing cover 6. The fastening sections 52 of the housing cover 6 have hook-shaped fastening heads 54 defining—like the fastening heads 48 of the housing lower part 4—contact surfaces 50. In view of the hook-shaped structural design of the fastening heads 54, said fastening heads 54 define the contact surfaces 50 as locking pins 56 projecting in the direction of the housing cover 6. Each locking pin 56 defines a retaining surface 58. The opposed contact surfaces 50 of the housing cover 6 on the one hand and the housing lower part 4 on the other have arranged between them a rod-shaped, i.e. cylindrical and elongate positive locking element 60.

For assembling the embodiment shown in FIGS. 1 to 4, the two housing parts 4, 6 are first produced as separate components. Subsequently, the sealing element 24 is installed in the groove 26. The housing cover 6 is then placed onto the housing lower part 4. Following this, the sealing element 24 is compressed by an external force, i.e. the two housing elements 4, 6 are pressed against one another thus compressing the sealing element 24. Due to this compression, the contact surfaces 50 of the housing cover 6 on the one hand and the contact surfaces 50 of the housing lower part 4 on the other are moved apart to the maximum possible extent. Then, the elongate positive locking element 60 is introduced between the fastening heads 48, 54 in its direction of longitudinal extension, i.e. in its main direction of extension, and consequently parallel to the outer wall 3, until the final position shown in FIGS. 1 and 2 has been reached. Subsequently, the housing lower part and the housing cover are relieved from the external force, so that the two parts move slightly apart due to the decreasing compression of the sealing element 24 and the contact surfaces 50, which are arranged in opposed relationship in the effective direction of force, approach one another until the contact surfaces 50 on both sides will come into contact with the positive locking element 60. The two housing parts 4, 6 are now in form fit engagement with one another and the sealing element is compressed. The pretensioning force caused by the sealing element 24 is maintained by the positive locking element 60. In addition, the retaining surfaces 58 of the hook-shaped fastening heads 54 of the housing cover 6 prevent the positive locking element 60 from migrating, e.g. due to vibration, in a direction substantially at right angles to the outer wall 3. The hook-shaped fastening heads 54 thus retain the positive locking element 60 in a form fit manner in a direction transversely to the elongate positive locking element 60 and prevent the positive locking element 60 from slipping off from the contact surfaces 50.

In the embodiment shown, identical configurations for accommodating and retaining the positive locking element 60 are provided on both longitudinal sides.

Figure 5:
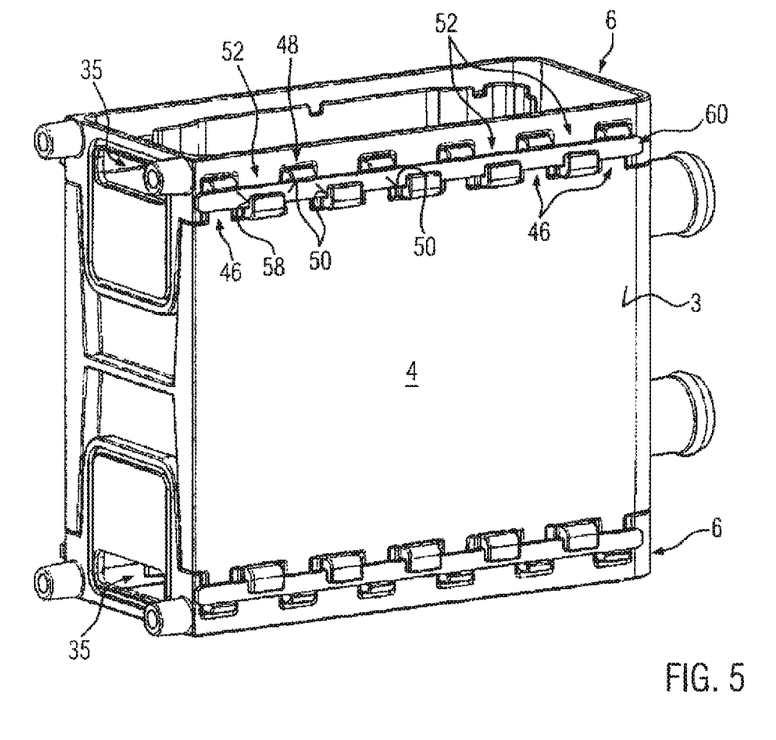
FIG. 5 shows a view according to FIG. 1 of a second embodiment.

FIG. 5 shows an embodiment which is slightly modified in comparison with the embodiment according to FIGS. 1 to 4. Identical components are identified by identical reference numerals.

Whereas in the first embodiment the positive locking element 60 is defined by a cylindrical rod having a circular cross-section, the positive locking element 60 according to the second embodiment shown in FIG. 5 has a rectangular cross-section and is configured as a rectangular rod. The hook-shaped fastening heads 54 of the housing cover 6 have a complementarily angled structural design so that the retaining surface 58 extends strictly at right angles to the associated contact surface 50. The fastening heads 48 of the housing lower part 4 essentially project from the associated fastening section 46 of the housing lower part 4 with a contact surface 50 extending at right angles to the outer wall 3.

Just as in the case of the first embodiment, also the positive locking element 60 according to the second embodiment is bevelled slightly conically at both ends, whereby the positive locking element 60 can be introduced more easily between the opposed contact surfaces 50.

In both embodiments, the positive locking element is retained in a form fit manner between the outer wall 3, which here continues in the fastening sections 46 and 52, respectively, and the retaining surfaces 48, the contact surfaces 50 preventing a movement at right angles thereto. End-side stops, which are not shown, can be installed when the positive locking element has been mounted or can be provided fixedly, at least on one side, on the housing lower part 4 and the housing cover 6, respectively, so as to prevent a longitudinal displacement of the positive locking element 60. The positive locking element 60 may just as well be provided with an opening cooperating with a protrusion projecting e.g. from the contact surface 50 of a single fastening head 48 and 54, respectively, so as to retain the positive locking element 60 in a form fit manner also in its main direction of extension and prevent a displacement caused by vibrations occurring under conditions of use in the motor vehicle.

Figure 6:
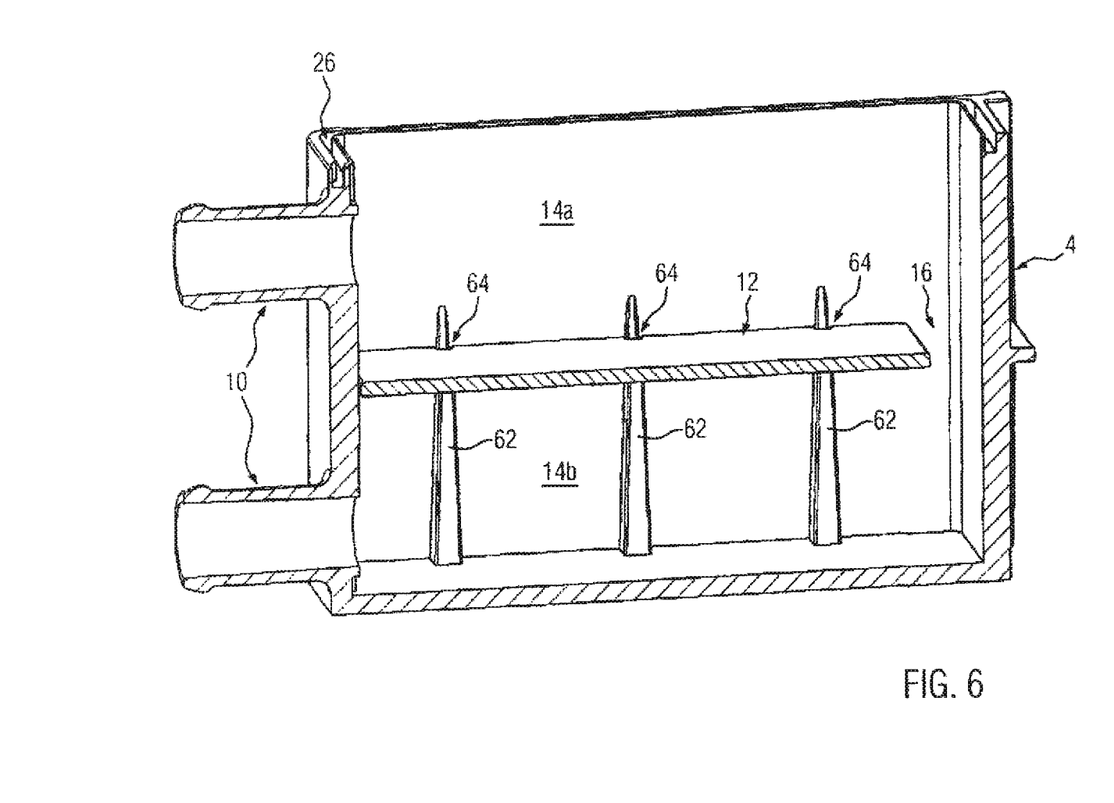
FIG. 6 shows a longitudinal sectional view of a housing lower part of a third embodiment.

FIG. 6 shows an embodiment of a housing lower part 4 with a partition 12, which is initially produced separately. The housing lower part 4 is provided with conically tapering support ribs 62 projecting in the interior thereof from a longitudinal wall and protruding into the circulation chamber 14a, 14b. The partition 12 is provided with recesses 64 associated with these support ribs 62. The partition 12, which is inserted into the housing lower part 4 from above, first slides down along the conical support ribs 62, the conicity of the support ribs 62 preventing the partition 12 from sliding down still further. The two circulation chambers 14a, 14b are thus divided off in the interior of the housing lower part 4 in a simple manner. Complete leak-proofness between the two chambers is not of importance.

The above described embodiments according to FIGS. 1 to 5 are each based on the principle of providing the fastening sections 46 and 52 alternately in the longitudinal direction of the positive locking element 60 and of brining them into engagement with one another. Respective neighbouring fastening sections 52 of the housing cover 6 engage between respective neighbouring fastening sections 46 of the housing lower part 4. The housing covers 6 are identical. The positive locking element 60 is basically configured as an unspecific cylindrical element and is introduced across the whole length of the outer wall 3 of the housing lower part. The positive locking element 60 is located approximately on the same level as the sealing element 24.

Figure 7:
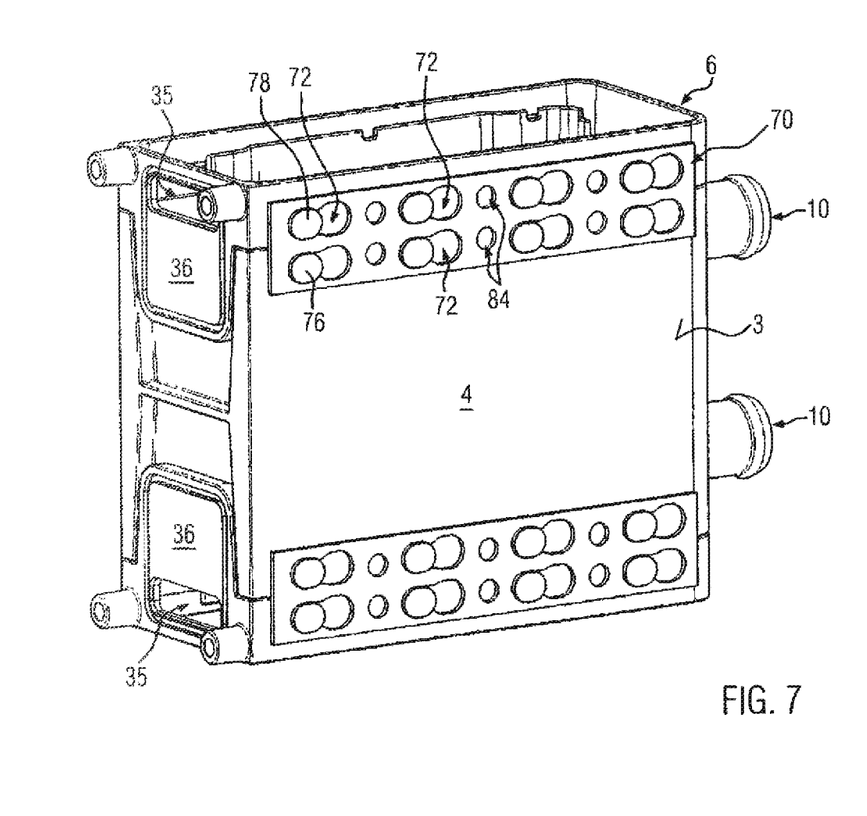
FIG. 7 shows a perspective side view according to FIGS. 1 and 6 of a fourth embodiment.
Figure 8:
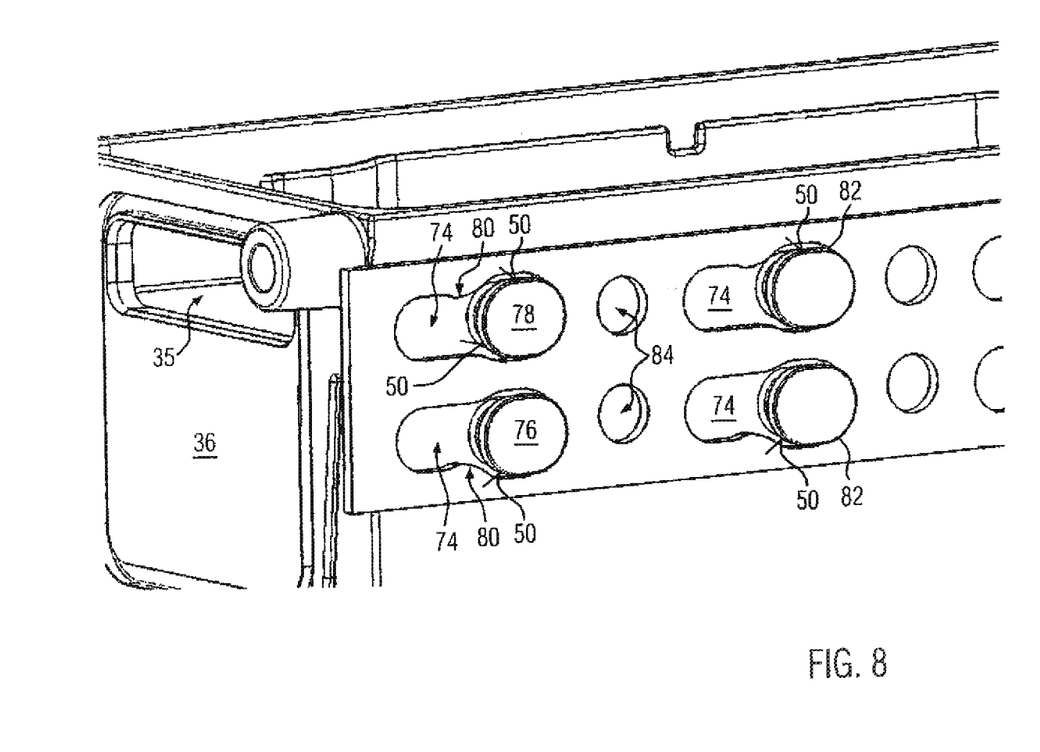
FIG. 8 shows the embodiment according to FIG. 7 before the housing is finally joined.
Figure 9:
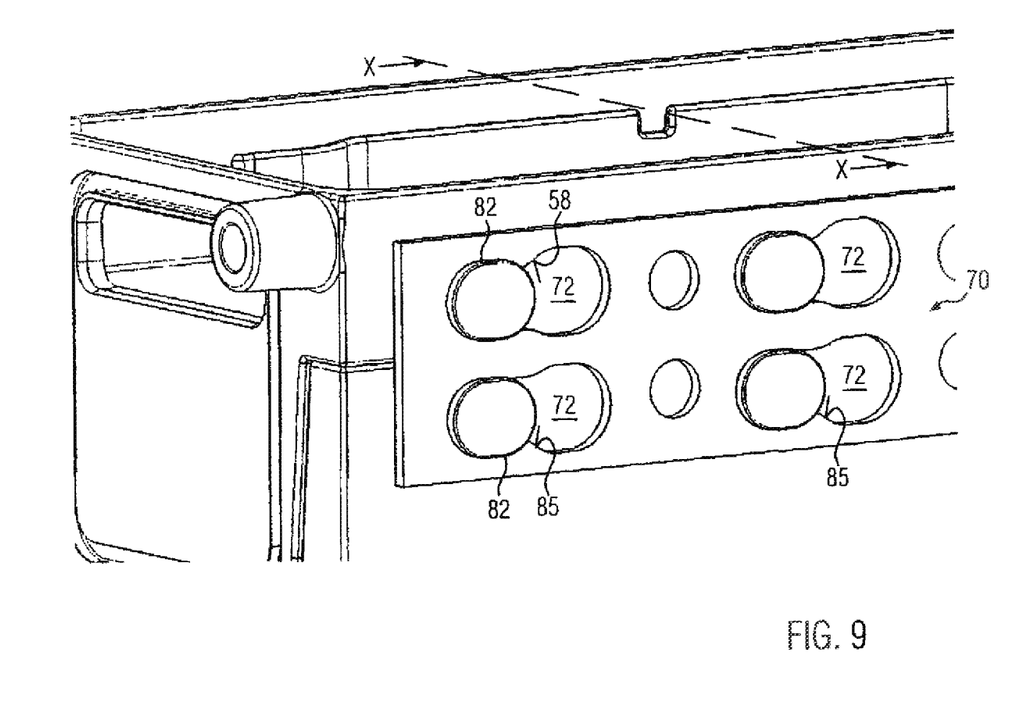
FIG. 9 shows the representation according to FIG. 8 after the housing has finally been joined.

The positive locking element 60 of the embodiment illustrated in FIGS. 7 to 9 is, however, a locking slide 70 which is configured as a punched sheet metal strip and which defines an embodiment of the elongate positive locking element. The locking slide 70 has insertion openings 72, which are larger than locking openings 74 adjoining said insertion openings 72 (cf. FIG. 8). The housing lower part 4 has provided thereon a plurality of successive locking heads 76 that are arranged on the same level. The housing cover 6 is provided with locking heads 78 that are arranged in the same way. The locking heads 76 and 78, respectively, extend across the whole length of the outer wall 3.

For the purpose of mounting, the locking slide is first arranged such that its insertion openings 72 are in alignment with the locking heads 76, 78. Then, the locking slide 70 is conducted across the locking heads 76, 78, i.e. the locking heads 76, 78 are passed through the insertion opening 72. Subsequently, the locking slide 70 abuts on the outer wall 3 of the housing lower part 4 and the housing cover 6.

Subsequently, an external force from outside is normally applied so as to press the housing lower part 4 and the housing cover 6 against one another, whereby the sealing element 24 will be compressed. Then, the locking slide 70 is displaced parallel to the outer wall 3, whereby the locking heads 76, 78 are transferred to the locking openings 74. The locking openings 74 and the insertion openings 72 have provided between them a cam 80, which engages behind the respective locking heads 76, 78 when said heads 76, 78 have been positioned in the locking openings 74, so that an inadvertent displacement of the locking slide 70 will be prevented when the external force has been relieved. The locking slide 70 is thus retained in its longitudinal direction in a form fit manner. The locking heads 76, 78 have their contact surface 50 in form fit engagement with an edge, which delimits the locking opening 74 and which is defined by the locking slide 70. In addition, the locking heads have a locking projection 82 protruding beyond the respective contact surface 50, said locking projection 82 protruding beyond the contact surface 50 like a plate and defining the end face of the locking heads 76, 78. This locking projection 82 overlaps the locking opening 74 so that the locking slide 70 is prevented from slipping off the locking heads 76, 78 in a movement perpendicular to the outer wall 3. The locking projection 82 thus defines the above discussed retaining surface by means of which the locking slide 70 is retained in a form fit manner.

In FIGS. 7 to 9 it can be seen that additional openings 84 are provided between the insertion and locking openings 72, 74. These openings 84 are engagement openings for a tool with which the locking slide 70 is displaced for transferring the heads 76, 78 from the insertion opening 72 to the locking opening 74. When such a tool is used, it may possibly not be necessary to press the housing lower part 4 against the housing cover 6 by applying an external force. The compression of the two housing parts 4, 6 is caused by a slope surface 85 defined by the cams 80 between the insertion opening 72 and the locking opening 74. However, also in the case of this embodiment the sealing element will be pressed beyond the position of use, when the locking heads 76, 78 pass the cam 80.

What is claimed is:

1. A sealed housing of an electric heating device to be installed in a motor vehicle, comprising:
   a housing lower part and a housing cover abutting on the housing lower part via an intermediate sealing element and being moveable toward and away from one another with compression and expansion of the sealing element, and
   an elongate positive locking element that is separate from the housing lower part and the housing cover, that is provided between opposed contact surfaces of the housing lower part and the housing cover, and that interconnects the housing lower part and the housing cover in a form fit manner,
   wherein the elongate positive locking element abuts on the opposed contact surfaces under a pretensioning force caused by compression of the sealing element such that abutment of the elongate positive locking element with the opposed contact surfaces maintains the compression of the sealing element.

2. The sealed housing according to claim 1, wherein the elongate positive locking element is retained in a form fit manner by retaining surfaces extending transversely to the elongate positive locking element and projecting from the contact surfaces of the housing lower part and the housing cover, respectively.

3. The sealed housing according to claim 1, wherein a projection is provided at least one of before and behind the elongate positive locking element in axial alignment therewith, the elongate positive locking element being held in its longitudinal direction by said projection in a form fit manner.

4. The sealed housing according to claim 1, wherein the housing lower part and the housing cover are provided with interengaging fastening sections which are provided alternately and in succession in the direction of extension of the elongate positive locking element and which define the contact surfaces.

5. The sealed housing according to claim 4, wherein the fastening sections comprise fastening heads projecting from an outer surface of the housing and defining the contact surfaces.

6. The sealed housing according to claim 5, wherein the fastening heads are hook-shaped, wherein the fastening head provided on the housing lower part comprises a locking pin which projects beyond the contact surface and which protrudes in the direction of the housing lower part, and/or wherein the fastening head provided on the housing cover comprises a locking pin which projects beyond the contact surface and which protrudes in the direction of the housing cover.

7. A sealed housing of an electric heating device to be installed in a motor vehicle, comprising:
   a housing lower part and a housing cover abutting on the housing lower part via an intermediate sealing element,
   a plurality of locking heads and a locking slide configured as an elongate positive locking element, wherein the locking heads are adapted to be passed through insertion openings formed on 1) at least one of the locking slide and the housing lower part, and 2) the housing cover, respectively, and are adapted to be inserted into locking openings adjoining the insertion openings by displacing the locking slide so that, due to the combined effect of the locking heads and the insertion openings, a form fit connection is accomplished between the housing lower part and the housing cover, the locking slide abutting on the locking heads under a pretensioning force caused by compression of the sealing element.

8. The sealed housing according to claim 7, wherein the locking heads comprise a locking projection protruding beyond the contact surface, and wherein the locking opening is adapted to the associated locking head such that, when the locking head is accommodated in the locking opening, the locking projection overlaps the locking opening.

9. The sealed housing according to claim 7, wherein a projecting locking cam is provided between the insertion opening and the associated locking opening.

10. The sealed housing according to claim 7, wherein the locking heads are provided on the housing lower part and the housing cover and project beyond an outer surface of the housing, and that the insertion and locking openings are formed on the locking slide.

11. The sealed housing according to claim 1, wherein the elongate positive locking element extends parallel to the outer surface of the housing.

12. The sealed housing according to claim 1, wherein the elongate positive locking element abuts on the outer surface of the housing.

13. The sealed housing according to claim 1, wherein the housing cover is formed of a highly heat-conductive material and forms a radiator, the radiator projecting at least into the housing lower part and being provided with a U-shaped opening which opens towards a connection chamber arranged in opposed relationship with the housing lower part, said U-shaped opening accommodating at least one electric heating element, and wherein the housing lower part is made of plastic.

14. The sealed housing according to claim 13, wherein the housing cover forms an edge which extends circumferentially around the connection chamber and on which a connection chamber cover rests.

15. A heating system for an electrically operated vehicle, the vehicle comprising a drive motor, a battery supplying power to the drive motor, a heat exchanger for exchanging heat between the battery and a fluid circuit, the heating system comprising: a water heater with a sealed housing, the sealed housing comprising a housing lower part and a housing cover abutting on the housing lower part via an intermediate sealing element and being moveable toward and away from one another with compression and expansion of the sealing element, and an elongate positive locking element that that is separate from the housing lower part and the housing cover, that is provided between opposed contact surfaces of the housing lower part and the housing cover, and that interconnects the housing lower part and the housing cover in a form fit manner, wherein the elongate positive locking element abuts on the opposed contact surfaces under a pretensioning force caused by compression of the sealing element such that abutment of the elongate positive locking element with the opposed contact surfaces maintains the compression of the sealing element.

16. A method of producing a sealed housing of an electric heating device to be installed in a motor vehicle, the electric heating device comprising a housing lower part and a housing cover abutting on one another via an intermediate sealing element, the method comprising,
(a) producing the housing lower part and the housing cover as separate components, and
(b) positioning the housing lower part and the housing cover such that they abut against one another under compression of the sealing element disposed therebetween, an external force being applied to the housing lower part and the housing cover, respectively, so as to compress the sealing element,
(c) after step (b), in a direction essentially parallel to a main direction of extension of the sealing element, positioning an elongate positive locking element between opposed contact surfaces of the housing lower part and the housing cover, and
(d) after step (c), relieving the external force from the housing lower part and the housing cover such that the opposed contact surfaces move into contact with the elongate positive locking element under a pretensioning force of the sealing element and such that abutment of the elongate positive locking element with the opposed contact surfaces maintains the compression of the sealing element.

17. A sealed housing of an electric heating device to be installed in a motor vehicle comprising:
a housing lower part and a housing cover abutting on the housing lower part via an intermediate sealing element and being moveable toward and away from one another with compression and expansion of the sealing element, wherein
an elongate positive locking element is provided that is separate from the housing lower part and the housing cover, that is provided between opposed contact surfaces of the housing lower part and the housing cover, and that interconnects the housing lower part and the housing cover in a form fit manner, wherein
the elongate positive locking element abuts on the opposed contact surfaces under a pretensioning force caused by compression of the sealing element such that abutment of the elongate positive locking element with the opposed contact surfaces maintains the compression of the sealing element, wherein
the positive locking element is retained in a form fit manner by retaining surfaces extending transversely to the elongate positive locking element and projecting from the contact surfaces of the housing lower part and the housing cover, respectively, and wherein
a projection is provided before and behind the elongate positive locking element in axial alignment therewith, said projection holding the elongate positive locking element in its longitudinal direction in a form fit manner.

18. The sealed housing according to claim 17, wherein the housing lower part and the housing cover are provided with interengaging fastening sections which are provided alternately and in succession in the direction of extension of the elongate positive locking element and which define the contact surfaces.

19. The sealed housing according to claim 18, wherein the fastening sections comprise fastening heads projecting from an outer surface of the housing and defining the contact surfaces.

20. The sealed housing according to claim 19, wherein the fastening heads are hook-shaped, and wherein at least one of 1) the fastening head provided on the housing lower part comprises a locking pin which projects beyond the contact surface and protrudes in the direction of the housing lower part, and 2) the fastening head provided on the housing cover comprises a locking pin which projects beyond the contact surface and protrudes in the direction of the housing cover.

* * * * *